(12) United States Patent
Chen et al.

(10) Patent No.: US 6,596,574 B2
(45) Date of Patent: Jul. 22, 2003

(54) METHOD FOR FORMING A FLASH REFERENCE CELL

(75) Inventors: Bin-Shing Chen, Hsinchu (TW); Chiyeh Lo, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/036,169

(22) Filed: Oct. 22, 2001

(65) Prior Publication Data

US 2003/0077862 A1 Apr. 24, 2003

(51) Int. Cl.[7] .......................................... H01L 21/8238
(52) U.S. Cl. ...................................................... 438/218
(58) Field of Search ........................... 438/257, 218–223

(56) References Cited

U.S. PATENT DOCUMENTS

| | | | |
|---|---|---|---|
| 6,285,240 B1 * | 9/2001 | Shiau et al. | 327/536 |
| 6,362,049 B1 * | 3/2002 | Cagnina et al. | 438/258 |
| 6,417,044 B1 * | 7/2002 | Ono | 438/241 |

\* cited by examiner

Primary Examiner—David Nelms
Assistant Examiner—Thao Le
(74) Attorney, Agent, or Firm—J.C. Patents

(57) ABSTRACT

A method is used to form a flash reference memory cell and comprises the following steps. A floating well is formed in a substrate. A first dielectric layer is formed to cover the substrate. A defined floating gate is formed on the first dielectric layer and aligned with the floating well. A second dielectric layer is formed on the substrate. A contact window is formed by defining the second dielectric layer to expose portions of the floating gate. A heavy ion implantation is performed on the exposed floating gate. A third dielectric layer is formed to cover the substrate and fills the contact window. The well region in the substrate is used as the isolation between the floating gate and the substrate to prevent the problems of over-etching in the contact window process and misalignment in the floating gate process. The heavy ion implantation process increases the amount of the dopant in the floating gate to reduce the resistance of the floating gate window, to improve the RC delay of the flash reference memory cell, and further to enhance the operation speed of the device.

17 Claims, 2 Drawing Sheets

METHOD FOR FORMING A FLASH REFERENCE CELL

BACKGROUND OF THE INVENTION

1. Field of Invention

The present invention relates to a method for a non-volatile memory. More particularly, the present invention relates to a method for forming a flash reference memory cell. According to the invention, a floating well region for isolation between a floating gate and a substrate is formed on the substrate to prevent the problems of over-etching in a contact window process and misalignment in a floating gate process.

2. Description of Related Art

A non-volatile memory has currently been applicable to a variety of electronic devices for storing structural data, program data, and other repetitive access data. And among all programmable non-volatile memories, electrically erasable and programmable read only memory (EEPROM) is the one memory device widely adopted in personal computers (PC) and electronic equipment. A conventional EEPROM comprises a transistor with a floating gate and serves to perform write, erase, and data storage operations. But, such memory cell also suffers from a slow access speed. So, he recent developed EEPROM, such as flash memory has been designed to have a higher access speed.

The flash memory exhibits a more advanced performance in accessing data, than any other kind of nonvolatile memory, such as electrically erasable and programmable read only memories, for reading and writing (or programming). The merits of high-speed operation in flash memory have been regarded as very adaptable to portable computing apparatuses, cellular phones or digital still cameras. In general, there are several kinds of the flash memory, such as the NAND-type in which memory cells are connected from a bit line in parallel and the NOR-type in which memory cells are connected from a bit line in serial. It is well known that the NOR-type flash memory has a competitive speed for data accessing, which makes the NOR-type more advantageous than the NAND-type in a high-frequency memory system. In addition, there are also AND-type and DINOR-type flash memories.

Generally, a flash memory cell of a flash memory comprises two gates, one is a floating gate and the other is a control gate. Charges can be stored in the floating gate. The control gate governs the access of data. The floating gate is located under the control gate and in a "floating" state. A flash memory further comprises a flash memory cell array consisting of flash memory cells, a flash reference memory cell array consisting of flash reference memory cells, and a sense amplifier, in which the flash memory cell array and the flash reference memory cell array are similar in structure. The sense amplifier can receive a flash current from the flash memory cell and a reference current from the flash reference memory cell to judge the logical state of the flash memory cell, then, the sensed data is output.

FIG. 1 is a schematic, cross-sectional view showing the structure of a flash reference memory cell according to the prior art. As shown in FIG. 1, a tunneling oxide layer 102 is formed on a substrate 100, a floating gate 104 is formed on the tunneling oxide layer 102, and a dielectric layer 106 is formed on the floating gate 104. The gate structure of the flash reference memory cell comprises the tunneling oxide layer 102, the floating gate 104, and the dielectric layer 106.

FIG. 2 is a schematic, cross-sectional view showing an over-etching occurring in a flash reference memory cell of FIG. 1 when a contact window is formed.

As shown in FIG. 2, when the contact window 108 is over-etched, the contact window 108 would directly connect to the substrate 100, causing a process failure.

In addition, while forming the floating gate 104, the doping amount thereof is not too high. However, if the doping amount is too low, the floating gate can cause depletion. As a result, the effective thickness of the oxide layer between the floating gate 104 and the substrate 100 is increased, and the driving current of the flash memory cell is reduced. In other words, the resistance between the floating gate 104 and the contact window 108 is increased in the flash reference memory cell, and the RC delay is increased. Thus, the operation speed of the device is affected.

SUMMARY OF THE INVENTION

The present invention provides a method for forming a flash reference memory cell. The invention comprises the following steps. A floating well region is formed in a semiconductor substrate. A first dielectric layer is formed to cover the substrate. A defined floating gate is formed on the first dielectric layer and is aligned to the floating well. A second dielectric layer is formed on the substrate. A contact window is formed by defining the second dielectric layer to expose portions of the floating gate. A implantation process is conducted to implant ions into the exposed floating gate. A third dielectric layer is formed to cover the substrate and fills the contact window.

According to the invention, the well region in the substrate is used as the isolation between the floating gate and the substrate to prevent the problems of over-etching in the contact window process and misalignment in the floating gate process. The ion implantation process increases the amount of the dopant in the floating gate to reduce the resistance of the floating gate window, and to improve the RC delay of the flash reference cell. In addition, the floating gates in a flash memory cell array can be formed by a light doping process to prevent the RC delay of the floating gate in the flash reference memory cell from being affected and further to enhance the operation speed of the device.

It is to be understood that both the foregoing general description and the following detailed description are exemplary, and are intended to provide further explanation oft he invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 3A:
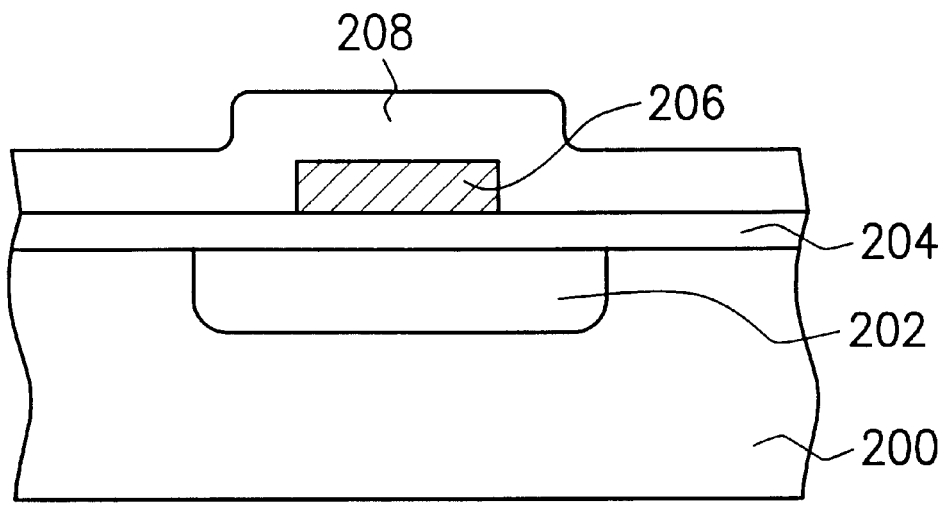
FIGS. 3A and 3B are schematic, cross-sectional views showing a process for forming a flash reference memory cell according to one preferred embodiment of the invention.
Figure 3B:
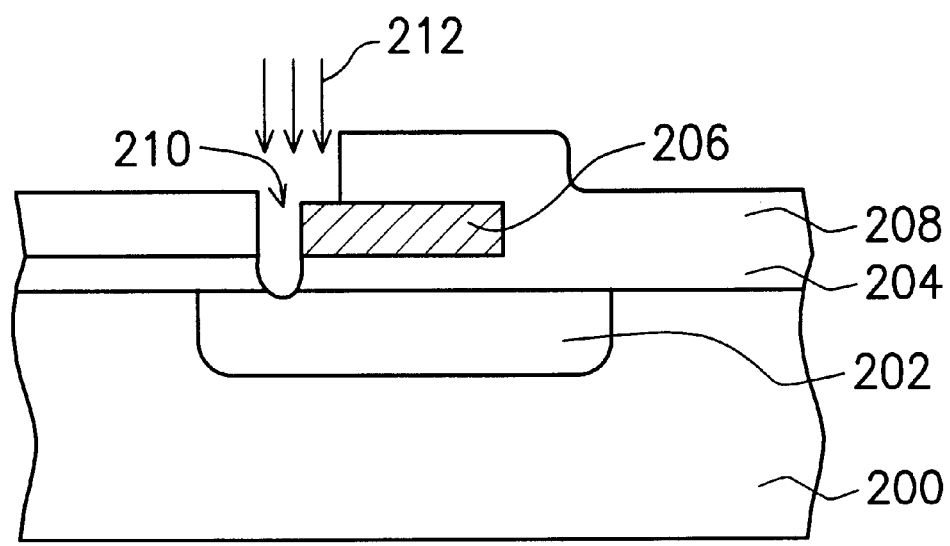

FIGS. 3A and 3B are schematic, cross-sectional views showing a process for forming a flash reference memory cell according to one preferred embodiment of the invention.

Referring to FIG. 3A, a floating well region 202 such as a floating N-type well region is formed in a semiconductor substrate 200 such as a P-type substrate. The floating well region 202 is used as an isolation layer between a later-formed floating gate 206 and the semiconductor substrate 200. The floating well region 202 can solve the problems of over-etching in the contact window process and misalignment in the floating gate process.

A dielectric layer 204 such as a tunneling oxide layer or a field oxide layer is formed on the substrate 200 by, for example, thermal oxidation. A defined floating gate 206 is formed on the dielectric layer 204 by, for example, low pressure chemical vapor deposition (LPCVD) and is aligned with the floating well region 202. The material used for the floating gate 206 comprises polysilicon. A dielectric layer 208 is formed on the substrate 200 by, for example, chemical vapor deposition wherein the dielectric layer 208 comprises an oxide-nitride-oxide layer.

Figure 1:
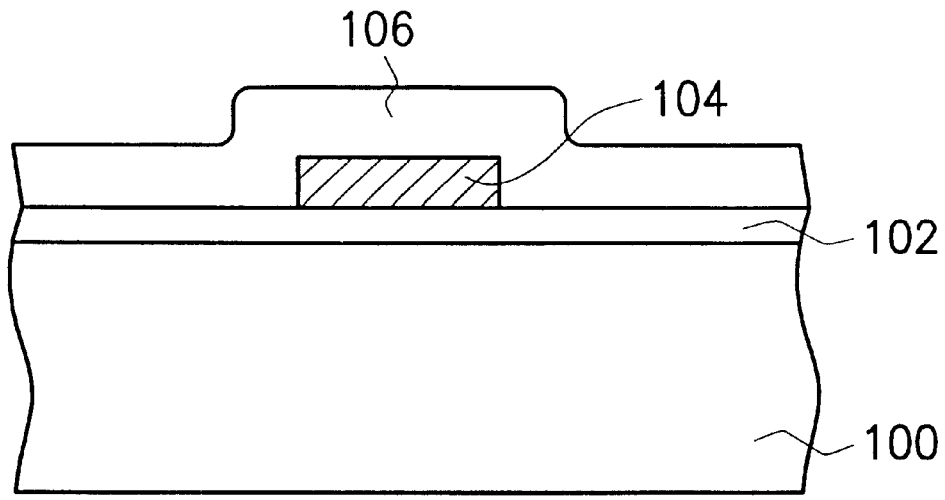
FIG. 1 is a schematic, cross-sectional view showing the structure of a flash reference memory cell according to the prior art.
Figure 2:
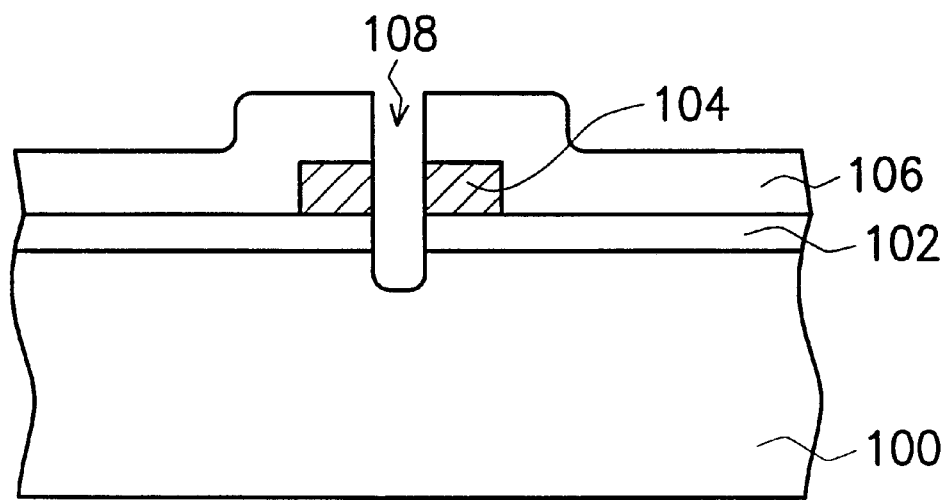
FIG. 2 is a schematic, cross-sectional view showing an over-etching occurring a flash reference memory cell of FIG. 1 when a contact window is formed.

Referring to FIG. 3B, the dielectric layer 208 is defined by, for example, a conventional photolithography and etching process to form a contact window 210 exposing a portion of the floating gate 206. However, the contact window 210 can even be etched to expose a portion of the floating well region 202, as shown in FIG. 3B. While FIG. 3B illustrates the contact window 210 forming adjacent to an edge of the floating gate 206, the location of the contact window 210 is not limited as described above. For example, the contact window 210 can also be formed to penetrate the floating gate 206 as illustrated in FIG. 2. And since the floating well region 202 is formed below the dielectric layer 204, problems of over-etching in the contact window process and misalignment in the floating gate process are prevented. Ions such as a phosphorus or arsenic are implanted into the exposed floating gate 206 in a heavy ion implantation process 212. The heavy ion implantation process is, for example, a N-type ion or a plug implantation to a concentration lower than $2.5 \times 10^{14}$ cm$^2$ in order to increase the amount of the dopant and to reduce the resistance between the floating gate 206 and the contact window 210 so as to improve the RC delay of the flash reference memory cell. In addition, the floating gates in a flash memory cell array can be formed by a lightly doping process to prevent the RC delay of the floating gate in the flash reference memory cell from being affected and further to enhance the operation speed of the device.

A dielectric layer (not shown) is formed to fill the contact window 210, and a flash reference memory cell is completed.

According to above, the invention has advantages as follows.

(1) The well region is formed in the substrate for isolation between the floating gate and the substrate to efficiently prevent the problems of over-etching in the contact window process and misalignment in the floating gate process.

(2) After forming the contact window, the heavy ion implantation process is performed to increase the amount of the dopant in the floating gate, to reduce the resistance of the floating gate window, and further to improve the RC delay of the flash reference cell. In addition, the floating gates in a flash memory cell array can be formed by a light doping process to prevent the RC delay of the floating gate in the flash reference memory cell from being affected and further to enhance the operation speed of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a flash reference memory cell, comprising:

forming a floating well region in a semiconductor substrate;

forming a first dielectric layer to cover the semiconductor substrate;

forming a defined floating gate on the first dielectric layer and aligned with the floating well; and forming a second dielectric layer to cover the semiconductor substrate.

2. The method according to claim 1, wherein forming the first dielectric layer comprises thermal oxidation.

3. The method according to claim 1, wherein the first dielectric layer comprises a tunneling oxide layer.

4. The method according to claim 1, wherein the first dielectric layer comprises a field oxide layer.

5. The method according to claim 1, wherein forming the floating gate comprises low pressure chemical vapor deposition.

6. The method according to claim 1, wherein forming the second dielectric layer comprises chemical vapor deposition.

7. The method according to claim 1, wherein the second dielectric layer comprises an oxide-nitride-oxide layer.

8. A method for forming a flash reference memory cell, comprising:

forming a floating well region in a semiconductor substrate;

forming a first dielectric layer to cover the semiconductor substrate;

forming a defined floating gate on the first dielectric layer and aligned with the floating well;

forming a second dielectric layer to cover the semiconductor substrate;

defining the second dielectric layer to form a contact window exposing portions of the floating gate;

implanting ions into the exposed floating gate by a heavy ion implantation process in order to increase an amount of a dopant; and forming a third dielectric layer to cover the semiconductor substrate and to fill the contact window.

9. The method according to claim 8, wherein forming the first dielectric layer comprises thermal oxidation.

10. The method according to claim 8, wherein the first dielectric layer comprises a tunneling oxide layer.

11. The method according to claim 8, wherein the first dielectric layer comprises a field oxide layer.

12. The method according to claim 8, wherein forming the floating gate comprises low pressure chemical vapor deposition.

13. The method according to claim 8, wherein forming the second dielectric layer comprises chemical vapor deposition.

14. The method according to claim 8, wherein the second dielectric layer comprises an oxide-nitride-oxide layer.

15. The method according to claim 8, wherein defining the second dielectric layer comprises a conventional photolithography and etching process.

16. The method according to claim 8, wherein a concentration of the dopant is lower than $2.5 \times 10^{14}$ cm$^2$.

17. The method according to claim 8, wherein the dopant is chosen from a group consisting of phosphorus ions and an arsenic ions.

* * * * *